United States Patent [19]

Valun et al.

[11] Patent Number: 4,661,741
[45] Date of Patent: Apr. 28, 1987

[54] MINIATURE ELECTRON GUN WITH FOCUSING GRID STRUCTURE

[75] Inventors: John Valun, Beverly; Kenneth J. Harte, Carlisle, both of Mass.

[73] Assignee: Control Data Corporation, Minneapolis, Minn.

[21] Appl. No.: 749,787

[22] Filed: Jun. 28, 1985

[51] Int. Cl.⁴ .................. H01J 29/48; H01J 19/46
[52] U.S. Cl. ............................... 313/447; 313/146
[58] Field of Search .................. 313/447, 336, 146

[56] References Cited

U.S. PATENT DOCUMENTS

| 3,436,584 | 4/1969 | Hughes et al. | 313/336 X |
| 4,068,145 | 1/1978 | Nakagawa et al. | 313/336 X |
| 4,258,283 | 3/1981 | Brünger et al. | 313/336 |

*Primary Examiner*—Palmer C. DeMeo
*Attorney, Agent, or Firm*—Charles W. Helzer; Ira C. Edell

[57] ABSTRACT

An electron gun includes a preferably non-metallic apertured grid with a flat upstream-facing surface closely spaced from and parallel to a flat emitting surface of a cathode. The grid aperture diverges in a downstream direction and has its peripheral wall contoured to shape the transverse cross-section of an emitted electron beam at a predetermined downstream location, preferably at the beam crossover. The peripheral wall of the grid aperture is devoid of sharp transitions, has a circular cross section to produce a circular beam crossover of minimum diameter, and has a convex segment extending from the upstream end of the aperture and joining a concave segment extending to the downstream end of the aperture. The convex first segment has a smaller radius of curvature than the second concave segment and has its center of curvature disposed substantially at the upstream facing surface. In the preferred embodiment the grid is made of a synthetic sapphire and the cathode is a thermionic cathode made of lanthanum hexaboride.

35 Claims, 2 Drawing Figures

MINIATURE ELECTRON GUN WITH FOCUSING GRID STRUCTURE

TECHNICAL FIELD

The present invention relates to electron guns of the type used in electron microscopes, electron beam lithography systems, and similar demountable high vacuum instruments requiring such guns for "probe" applications. More particularly, the invention relates to an inexpensive electron gun having grid and cathode structures which permit optimal shaping of the emitted electron beam. The electron gun of the present invention has particular utilization in the system described in copending U.S. patent application Ser. No. 749,796, filed June 28, 1985 and entitled "Multiple Channel Electron Beam Optical Column Lithography System and Method of Operation" by Kenneth J. Harte and the system described in U.S. Pat. No. 4,390,789 (Smith et al).

BACKGROUND OF INVENTION

Electron guns employed for "probe"-type applications are generally provided with a pointed cathode taking the form of either a sharpened cylinder or the apex of a wire hairpin. The pointed cathode is positioned within a cylindrical aperture of a whenelt cup-shaped electrode. Guns thusly constructed have a disadvantage in that it is difficult to maintain the cathode configuration and the relative positioning of the cathode and grid electrode during operation. In addition, electron guns of the type described are expensive to fabricate because of the cost of configuring the relatively exotic single crystal material, such as lathanum hexaboride, required for the cathode. Further, the possibility of outgassing of the metallic wehnelt cup by back ion bombardment or arcing can result in a destructive discharge to the cathode tip.

OBJECTS AND SUMMARY OF THE INVENTION

It is therefore an object of the present invention to provide an electron gun which eliminates the above-described faults and disadvantages within sacrificing the high brightness and high efficiency obtainable from an electron gun with a pointed cathode.

It is another object of the present invention to provide an electron gun having an improved cathode and grid structure which permits optimal shaping of the emitted electron beam.

Another object of the present invention is to replace the conventional pointed cathode and the cylindrical grid aperture in an electron gun with novel grid and cathode structures that permit the positioning of the emitted beam to be easily maintained during operation.

It is a further object of the present invention to provide an improved cathode and grid for miniature electron gun such that the gun can be fabricated at considerably lower cost than conventional electron guns employing pointed cathodes positioned in cylindrical grid apertures.

Still another object of the present invention is to provide an improved electron gun structure which eliminates the need for a wehnelt cup grid while retaining the advantageous high brightness and high efficiency characteristics of conventional pointed cathodes.

In accordance with the present invention an electron gun includes a cathode having a flat emitting surface closely spaced from and parallel to a flat upstream-facing surface of a preferably non-metallic apertured grid. The grid aperture is bounded by a divergent wall terminating at a downstream-facing surface of the grid. The aperture wall is contoured to optimally configure the cross-section of the emitted electron beam, preferably at the beam crossover location. In the preferred embodiment, the beam crossover is circular with as small a diameter as possible and the grid aperture has a circular transverse cross-section of increasing diameter in a downstream direction. The longitudinal cross-section of the aperture wall has no sharp transitions and, in the preferred embodiment, has a convex segment extending downstream from the upstream-facing surface with a relatively small radius of curvature centered at or near the upstream-facing surface. A second concave segment of the aperture wall extends upstream from the downstream-facing surface and meets the first segment in a smooth transition. The radius of curvature of the concave second segment is considerably larger than that of the convex first segment. The preferred material for the grid is synthetic sapphire which is made inexpensively in abundant quantity, and with great precision as jewels for watches. The grid can thus be made inexpensively and is an easily replaceable part. The cathode is preferably a thermionic cathode made of lanthanum hexaboride. The sapphire grid is relatively non-reactive to such exotic cathode materials, thereby insuring a long-term stability of the flat sapphire surface to exotic material deposition.

The resulting structure permits the cathode position to be defined with high precision and in fixed relation to the grid throughout the operating life of the gun, thereby assuring accurate positioning of the electron beam relative to its target area. The flat emitting surface of the cathode is considerably larger than the grid aperture so that radial position changes (i.e., "squirm") of the cathode does not affect electron flow or beam spot positioning. High efficiency (i.e., high emission current density at low total emission current) is obtained by the combination of a closely-spaced flat cathode and shaped grid aperture. The flat cathode also minimizes waste during fabrication and is less expensive to fabricate than the pointed cathode.

Bulk outgassing of the non-metallic grid is negligible compared to metallic grids, thereby shortening the time required to activate the gun and extending the cathode life.

BRIEF DESCRIPTION OF THE DRAWINGS

These and other objects, features and many of the attendant advantages of the present invention will be appreciated more readily as the invention becomes better understood from a reading of the following detailed description considered in connection with the accompanying drawings wherein like parts in each of the several figures are identified by the same reference characters and wherein.

DESCRIPTION OF THE PREFERRED EMBODIMENT

Figure 1:
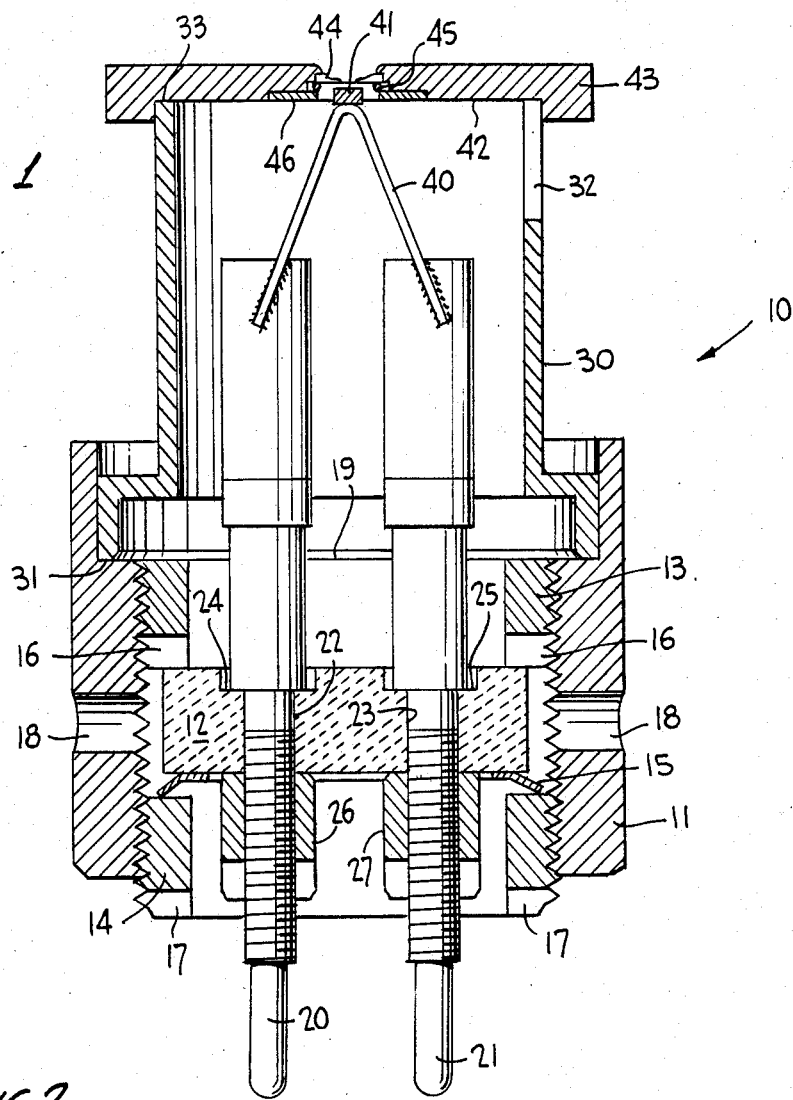
FIG. 1 is a view in vertical cross-section of an electron gun module employing the electron gun of the present invention.

Referring specifically to FIG. 1 of the accompanying drawings, a miniature electron gun module 10 of the present invention includes a hollow outer ring member 11 of generally cylindrical configuration. The outer ring member 11 has an interior cylindrical wall which is threaded to engage the threaded outer walls of respective nut members 13, 14. The nut members are axially spaced from one another on opposite sides of a ceramic disk 12 disposed interiorally of the outer ring 11. A spring washer 15, such as a Belleville washer, is disposed between disk 12 and lower nut member 14. The axial position of disk 12 in outer ring 11 is determined by the axial position of the two nut members 13, 14. More particularly, the upper nut member 13 is first placed in the desired axial position by rotating the nut in its threaded engagement within the outer ring 11. As illustrated in FIG. 1, the lower surface of the nut member 13 is provided with four angularly spaced recesses 16 (only two of which are illustrated in FIG. 1) which extend radially through the nut member and serve as access points for a special tool used to rotate the nut members within ring 11, such tool being inserted from the open bottom end of ring 11. Disk 12 is placed within ring 11 such that the upper surface of the disk abuts the lower surface of nut member 13. In this regard, the diameter of disk 12 is larger than the inner diameter of nut member 13 but smaller than the inner diameter of ring 11 so that the disk is radially spaced from the inner wall of the ring. The convex surface of spring washer 15 is then placed against the lower surface of disk 12 so that the concave surface of the washer faces the open lower end of ring 11. Lower nut member 14 is then threadedly inserted into the ring 11 until the upper surface of that nut engages the lower tip of washer 15. Nut member 14 is also provided with four angularly spaced recesses 17, similar to recesses 16 in nut member 13, which serve as access points for the nut-tightening tool. Nut member 14 is turned until it is secure but not maximally tight against washer 15 so that the axial position of the disk 12 is fixed but its radial position is still adjustable by appropriately applied radial force against the radially outer wall of the disk. In this regard, four radial adjustment ports 18 are defined through the wall of ring 11 to permit insertion of appropriate adjustment screws (not shown) into the ring interior to radially position the disk. Typically, the adjustment screws are part of a fixture (not shown) which surrounds gun module 10 so that the adjustment screws are positionally fixed both axially and angularly relative to ring 11 but can be inserted through ports 18 to contact and radially re-position the disk 12 as desired.

Disk 12 is the primary support member for the filament and cathode of the gun module. Specifically, first and second post members 20, 21 extend longitudinally in ring 11 through respective axially directed bores 22, 23 extending through the disk. Bores 22 and 23 are diametrically widened at the top surface of the disk to form respective upwardly facing annular shoulders 24 and 25. Post members 20, 21 include respective downwardly-facing annular shoulder portions which abut shoulders 24 and 25. A portion of each post member extending through and below disk 12 is threaded to engage respective nuts 26 and 27 tightened against the lower surface of disk 12. Post members 20, 21 are thus positionally fixed relative to disk 12 by the shoulder abutment at one side of the disk and the threaded engagement at the bottom side of the disk. The lower ends of post members 20, 21 extend through the open lower end of ring member 11 for appropriate electrical connection to filament supply lines as provided in the system with which the gun module 10 is employed.

The upper ends of the post members 20, 21 extend through the open upper end of ring 11 into a space enclosed by a sleeve member 30. The lower end of sleeve member 30 is radially widened and has an annular bottom edge 31 which abuts annular upwardly-facing interior shoulder 19 formed at the upper end of ring 11. Shoulder 19 is surrounded by an axially upward-extending wall portion 31 of ring member 11, the inner surface of which is brazed to the radially outer wall of the widened bottom portion of sleeve 30. A viewing and exhaust port 32 is defined through the wall of sleeve 30 proximate the upper end of the sleeve to permit gases to be exhausted from the enclosure and to permit viewing of the cathode during positioning of disk 12 within ring 11.

Figure 2:
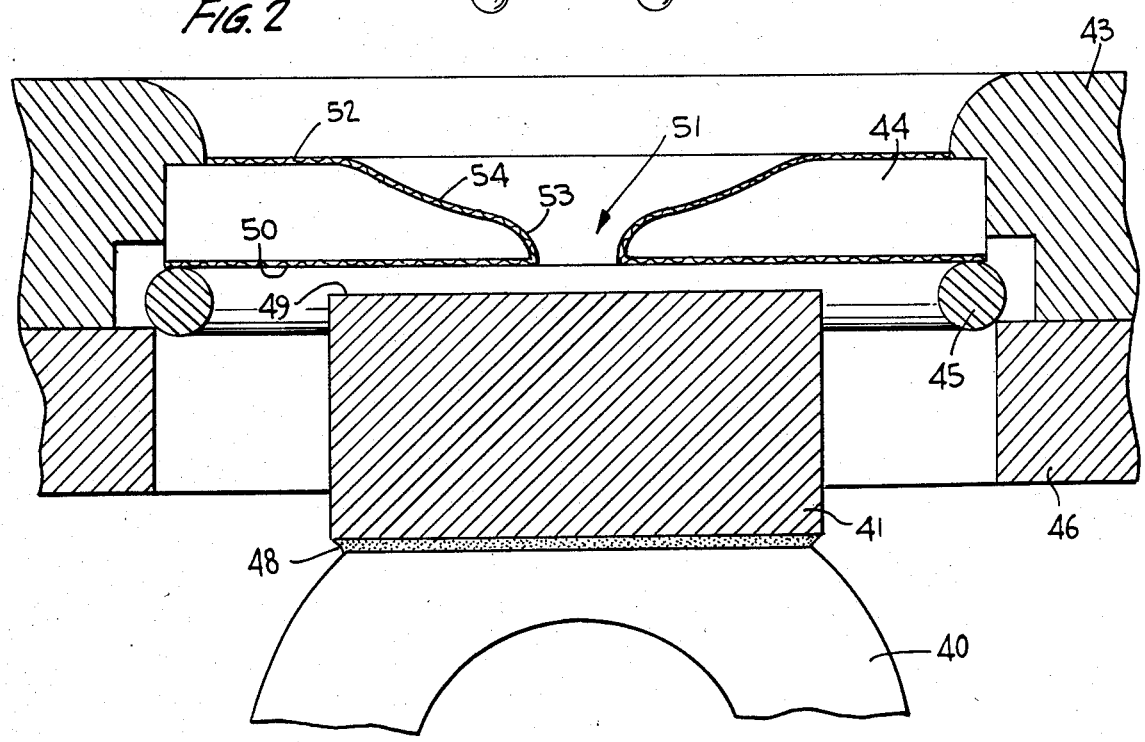
FIG. 2 is a detailed view in section of the cathode and grid portions of the electron gun module of FIG. 1.

A hairpin shaped filament member 40 has its ends welded to respective post members 20, 21 in the space enclosed by sleeve 30. The apex of the filament is approximately radially centered within sleeve 30 and axially positioned approximately even with the upper annular edge 33 of the sleeve. A thermionic cathode 41, more fully described below in relation to FIG. 2, is fused to the distal end of the filament at the filament apex and extends into a recess defined in the bottom surface 42 of a grid mount structure 43. The grid mount structure 43 is a disk which is brazed to and closes the upper end of sleeve 30. An apertured preferably non-metallic grid 44, also described in greater detail below, is supported in the grid mount recess by means of a split snap ring 45 and a washer 46.

It will be appreciated that cathode 41 is positionally fixed relative to disk 12 and therefore can be axially and radially re-positioned relative to the grid 44 by axially and radially positioning the disk in the manner described above. Viewing port 32 permits observation of the cathode and grid during the re-positioning procedure.

Referring to FIG. 2, the apex of filament 40 is directly fused to the bottom surface of thermionic cathode 41 at fusion region 48. The filament is directly heated by passing current therethrough to provide the desired cathode operating temperature. The cathode 41 is a thermionic electron emitter, preferably made of single crystal lanthanum hexaboride, and emits electrons from its downstream-facing surface 49 (i.e., the upper surface in FIG. 2). This downstream-facing surface 49 of cathode 41 is flat and parallel to and closely spaced from the flat upstream-facing surface 50 of grid 44.

Grid 44 is a centrally-apertured disk which, in the preferred embodiment, is made of synthetic sapphire material. The central disk aperture 51 has its peripheral wall specifically contoured to optimally shape the electron beam which passes through the aperture from cathode 41. In the preferred embodiment, the peripheral wall of aperture 51 is contoured to provide a beam having a minimum diameter at the beam crossover (not illustrated) which is located downstream of the grid. Such a beam is required for achieving high brightness and high efficiency operation.

Viewing the contour of the grid aperture wall in longitudinal section (as illustrated in FIG. 2), important general characteristics of the contour include: (1) a general divergence from the upstream-facing surface 50 of the grid to the downstream-facing surface 52 of the grid; and (2) the absence of sharp transitions in the contour. In the particular illustrated embodiment, which is designed for optimum brightness and efficiency, the aperture wall contour includes two main segments. A first convex segment 53 extends downstream from the upstream-facing surface 50 through a relatively short axial distance and has a relatively small radius of curvature compared to the second segment 54. Segment 54 is concave and extends upstream from the downstream-facing surface 52 of the grid to join segment 53 in a smooth transition. The center of curvature of segment 53 is located at or near the upstream-facing surface 50; the center of curvature of segment 54 is located a considerable distance downstream of grid 44. The divergence of the aperture wall is relatively small at the upstream end of the aperture. In this regard, the tangent to segment 53 at its intersection with the upstream-facing surface 50 is between 70° and 90°. The rate of divergence increases, however, throughout segment 53 due to its convex configuration. The relatively large radius of curvature for segment 54 prevents the rate of divergence from decreasing significantly along that segment.

In the illustrated embodiment the grid 44 is shown with a thin coating that acts to drain charge and to present a conductive surface to the next downstream element (the extractor electrode, not shown) in the system, which element is at a relatively high potential (e.g., 10 kV) with respect to the grid. The coating, in the preferred embodiment, is a chromium coating having thickness of between two hundred to five hundred Ångstroms. The preferably non-metallic grid is preferably made of synthetic sapphire and is in the form of a disk. The grid mount 43 is preferably made of molybdenum and is a precisely machined member contoured to receive the grid in a central aperture. Washer 46 is also preferably made of molybdenum and is brazed to the grid mount 43 to form a seat for the snap ring 45. Snap ring 45 is a split ring of tungsten wire having a diameter slightly larger than the inner diameter of the washer so that, upon insertion, the snap ring produces an even force against grid 44 to firmly retain the grid against the grid mount 43 under all operating conditions.

Filament 40 is preferably made of rhenium and, as described above, is attached by direct fusion at fusion region 48 to the bottom surface of the thermionic cathode 41.

The sleeve 30 and ring 11 illustrated in FIG. 1 are preferably made of molybdenum. Post members 20 and 21 are preferably made of Monel.

In an actual embodiment of the invention which has been constructed and tested, the synthetic sapphire grid was in the form of a disk having an outside diameter of 0.050 inches, a thickness of 0.005 inches and a diameter for the grid aperture as small as 0.004 inches and as large as 0.016 inches at its smallest point. Snap ring 45 was made of 0.004 inch diameter tungsten wire. Cathode 41 was a single crystal lanthanum hexaboride pellet having a 0.030 inch diameter and a 0.020 inch thickness. The spacing between surface 49 and 50 was 0.003 inches. The cathode was operated at temperatures in the range between 1450° and 1500° C. Filament 40 was a rhenium hair pin configuration heated by a filament voltage of 1.0 volts and a filament current of 4.0 amperes to produce the desired operating temperature for cathode 41. The overall length of the gun module 10, from the upper surface of grid mount 43 to the bottom ends of posts 20, 21 was 1.25 inches. The diameter of outer ring 11 was 0.640 inches. It can be seen from these dimensions that this gun is extremely small and therefore particularly suited to applications requiring miniature or closely spaced electron beam optical columns such as multipe channel electron beam lithography.

A typical set of performance parameters for the electron gun of the present invention confirmed by measurements with a (100) single crystal lanthanum hexaboride cathode, are as follows: emission current density—5.5 A/cm$^2$; brightness—1.2×10$^5$ A/cm$^2$ ster; and total emission current—650 microamperes at an acceleration voltage of 10 kV, a cathode temperature of 1450° C.$_{BR}$, and grid bias of −27.5 volts (cut off of −75 volts). These parameters are similar to what may be obtained with a conventional pointed cathode but are obtained by means of the present invention with a more rugged, more stable and less expensive electron gun.

By means of the present invention it is possible to provide desired electron beam properties by simply tailoring the configuration of the grid aperture 51. In many cases, this will be effected by computer simulation on an empirical basis; nevertheless, desired beam configurations can be achieved whereas such is not the case with the prior art grid having a straight through orifice used in conjunction with a pointed cathode. The flat downstream-facing surface of the cathode of the present invention, closely spaced from the flat upstream-facing surface of the grid, is what permits the electron beam properties to be achieved by tailoring the grid aperture.

The advantage of synthetic sapphire as the material for the grid resides in the fact that such material is plentiful, inexpensive, and highly precise by virtue of its use in the timepiece industry. Low cost and availability, therefore, are the advantageous characteristics of synthetic sapphire. However, from a purely functional point of view, substantially any grid material may be employed.

Although it is crucial, from the standpoint of the present invention, that the downstream facing surface 49 of cathode 41 be flat, from a functional point of view, it is not necessary that the upstream-facing surface 50 of the grid be flat. However, as a practical matter, when surface 50 is flat it is much easier to control the spacing between the grid and cathode. This spacing should be as small as can be accurately controlled. In the case when both surfaces are flat, the spacing can be made smaller and controlled to a much greater extent than is the case where the grid is merely an unshaped device. This spacing is generally related to the minimum dimension of the emitted electron beam at the beam crossover location. As a general guideline, for a circular beam crossover having a diameter x, the spacing between the grid and cathode (i.e., between surface 49 and 50) is between 2x and 10x. Under such circumstances, the smallest diameter portion of aperture 51 (i.e., the diameter of aperture 51 taken at surface 50) is desirably in the range between 5x and 25x.

The miniature electron gun of the present invention has numerous advantages. Specifically, the grid aperture 51 and the grid mount 43 define a cathode position with high precision determined by the high precision of the machine tools employed to fabricate the grid and grid mount. This cathode position remains fixed during temperature cycling and operation throughout the life of the gun. The flat cathode 41, brought to high temperature by resistance heating, can change position radially (i.e., "squirm") without affecting electron flow or beam spot position. Flat-surfaced cathode 41 requires much less material and is much less expensive to fabricate than is the case for precision pointed cathodes of the prior art. Erosion of the flat cathode surface 49, regardless of the mechanism, will have a lesser effect on electron gun operation than will a comparable erosion of a delicate pointed cathode. Bulk outgassing of the non-metallic grid 44, regardless of the mechanism, is negligible compared to metallic grids; this permits shorter times for activating the gun and extends the overall cathode life.

The preferably non-metallic grid, particularly a synthetic sapphire grid, is relatively non-reactive to the exotic materials used for cathodes, such as lanthanum hexaboride. This provides for long-term stability of the preferably non-metallic surface of the grid with respect to material deposition thereon, regardless of the deposition mechanism.

Finally, high efficiency (i.e., high emission current density at low total emission current) is obtained by the combination of a flat cathode surface 49 closely spaced with respect to a non-metallic grid having a shaped grid aperture 51.

As noted above, the electron gun of the present invention has use in numerous electron beam applications, particularly in electron beam lithography and inspection systems. Such systems have a principal commercial use in the fabrication of microminiaturized semiconductor circuit patterns by direct electron beam writing on discrete assigned surface areas of semiconductor wafer targets used in the fabrication of electronic microcircuits.

Having described an embodiment of an improved electron gun according to the present invention, it is believed obvious that other modifications and variations of the invention will be suggested to those skilled in the art in light of the above teachings. It is therefore to be understood that changes may be made in the particular embodiment of the invention described, which changes are within the full intended scope of the invention as defined by the appended claims.

What is claimed is:

1. A miniature electron gun for providing an electron beam having a predetermined transverse cross-sectional configuration at a pre-established location downstream of the gun, said electron gun comprising:
    a cathode for emitting said electron beam and having a substantially flat surface facing said pre-established downstream location, said flat surface having a predetermined periphery;
    a grid structure for focusing said electron beam, said grid structure being disposed between said cathode and said pre-established downstream location, said grid structure having a flat upstream-facing surface closely spaced from and substantially parallel to said flat surface of said cathode, a downstream-facing surface facing said downstream location, and an aperture extending lengthwise between said upstream-facing surface and said downstream-facing surface and circumscribed by an aperture wall generally converging from said downstream-facing surface to said upstream-facing surface, whereby the aperture has a smallest dimension at said upstream-facing surface, said smallest dimension of said aperature being very much smaller than said flat surface of said cathode and longitudinally aligned so as to be entirely within said predetermined periphery;
    wherein said aperture is several times larger at said downstream-facing surface than at said upstream-facing surface, and wherein said aperture wall is contoured to shape said electron beam to said predetermined transverse cross-sectional configuration at said pre-established downstream location.

2. The electron gun according to claim 1 wherein said aperture has a substantially circular transverse cross-section throughout its length, said circular cross-section having a diameter which varies with the aperture length.

3. The electron gun according to claim 2 wherein said aperture wall has a longitudinal cross-section having first and second segments, said first segment extending downstream from said upstream-facing surface and having a substantially arcuate convex configuration, said second segment extending upstream from said downstream-facing surface to join said first segment in a smooth transition.

4. The electron gun according to claim 3 wherein said second segment has a substantially arcuate concave configuration.

5. The electron gun according to claim 4 wherein said second segment has a radius of curvature very much larger than the radius of curvature of said first segment.

6. The electron gun according to claim 5 wherein said first segment has a center of curvature located substantially at said upstream-facing surface of said grid structure.

7. The electron gun according to claim 5 wherein the tangent to said first segment at said upstream-facing surface subtends an angle in the range between seventy degrees and ninety degrees with said upstream-facing surface.

8. The electron gun according to claim 7 wherein said predetermined transverse configuration of said beam is the transversely narrowest part of the beam and includes a smallest transverse dimension x of the beam, and wherein said upstream-facing surface of said grid structure is spaced from the flat surface of said cathode structure by a distance in the range between 2x and 10x.

9. The electron gun according to claim 8 wherein said aperture at said upstream-facing surface has a diameter in the range between 5x and 25x, and wherein said diameter is larger than the distance between the flat surface of the cathode structure and said upstream-facing surface.

10. The electron gun according to claim 7 wherein said predetermined transverse configuration of said beam is a circular configuration, and wherein said smallest transverse dimension x is the diameter of said circular configuration.

11. The electron gun according to claim 10 wherein said grid structure is a synthetic sapphire body.

12. The electron gun according to claim 11 further comprising charge draining means in the form of a metallic coating on said downstream-facing surface, said metallic coating having a thickness in the range of two hundred to five hundred Ångstroms.

13. The electron gun according to claim 10 further comprising filament means directly fused to said cathode for heating said cathode to a sufficient temperature to emit said electron beam.

14. The electron gun according to claim 3 wherein said predetermined transverse configuration of said beam is the transversely narrowest part of the beam and includes a smallest transverse dimension x of the beam, and wherein said upstream-facing surface of said grid structure is spaced from the flat surface of said cathode structure by a distance in the range between 2x and 10x.

15. The electron gun according to claim 1 wherein said grid structure is a synthetic sapphire body.

16. The electron gun according to claim 1 wherein said aperture wall has a longitudinal cross section having first and second segments, said first segment extending downstream from said upstream-facing surface and having a substantially arcuate convex configuration, said second segment extending upstream from said downstream-facing surface to join said first segment in a smooth transition.

17. The electron gun according to claim 16 wherein said first segment has a center of curvature located substantially at said upstream-facing surface of said grid structure.

18. The electron gun according to claim 16 wherein the tangent to said first segment at said upstream-facing surface subtends an angle in the range between seventy degrees and ninety degrees with said upstream-facing surface.

19. The electron gun according to claim 1 wherein said cathode is a thermionic cathode.

20. The electron gun according to claim 19 wherein said thermionic cathode is a single crystal lanthanum hexaboride pellet.

21. The electron gun according to claim 13 further comprising:
a housing having a peripheral wall and a longitudinal axis extending in the same general direction as the electron beam emitted from said cathode, said electron gun being disposed within said housing;
a plurality of post members extending longitudinally within said housing and supporting said filament means within said housing in spaced relation to said peripheral wall;
support means disposed in said housing for supporting said plurality of post members;
axial positioning means for selectively axially repositioning said support means and plurality of post members simultaneously in a direction parallel to said longitudinal axis;
transverse positioning means for selectively repositioning said support means and plurality of post members simultaneously in a direction transverse to said longitudinal axis;
wherein said axial positioning means and said transverse positioning means are mutually independent to permit independent axial and transverse displacement of said electron gun in said housing.

22. The electron gun according to claim 21 wherein said peripheral wall of said housing is internally threaded; and
wherein said axial positioning means includes first and second nut members disposed within said housing on opposite axial sides of said support means, each nut member being apertured to permit extension of said plurality of post members therethrough and having an outer peripherally threaded surface arranged to threadally engage said threaded peripheral wall of said housing.

23. The electron gun according to claim 22 wherein said transverse positioning means comprises a plurality of radially extending ports defined in the peripheral wall of said housing to pass adjustment screws into abutting relationship with said support means.

24. The electron gun according to claim 22 further comprising resilient means disposed between said support means and one of said nut members for providing resilient axial engagement between said one nut member and one said support means.

25. The electron gun according to claim 21 wherein said transverse positioning means comprises a plurality of radially extending ports defined in the peripheral wall of said housing to pass adjustment screws into abutting relationship with said support means.

26. The electron gun according to claim 1 further comprising:
filament means secured to said cathode for heating the cathode to a sufficient temperature to emit said electron beam;
a housing having a peripheral wall and a longitudinal axis extending in the same general direction as the electron beam emitted from said cathode, said electron gun being disposed within said housing;
a plurality of post members extending longitudinally within said housing and supporting said filament means within said housing in spaced relation to said peripheral wall;
support means disposed in said housing for supporting said plurality of post members;
axial positioning means for selectively axially repositioning said support means and plurality of post members simultaneously in a direction parallel to said longitudinal axis;
transverse positioning means for selectively repositioning said support means and plurality of post members simultaneously in a direction transverse to said longitudinal axis;
wherein said axial positioning means and said transverse positioning means are mutually independent to permit independent axial and transverse displacement of said electron gun in said housing.

27. The electron gun according to claim 26 wherein said peripheral wall of said housing is internally threaded; and
wherein said axial positioning means includes first and second nut members disposed within said housing on opposite axial sides of said support means, each nut member being apertured to permit extension of said plurality of post members therethrough and having an outer peripherally threaded surface arranged to threadally engage said threaded peripheral wall of said housing.

28. The electron gun according to claim 27 wherein said transverse positioning means comprises a plurality of radially extending ports defined in the peripheral wall of said housing to pass adjustment screws into abutting relationship with said support means.

29. The electron gun according to claim 27 further comprising resilient means disposed between said support means and one of said nut members for providing resilient axial engagement between said one nut member and one said support means.

30. The electron gun according to claim 26 wherein said transverse positioning means comprises a plurality of radially extending ports defined in the peripheral wall of said housing to pass adjustment screws into abutting relationship with said support means.

31. A miniature electron gun for providing an electron beam having a predetermined transverse cross-sectional configuration at a pre-established location downstream of the gun, said electron gun comprising:

a cathode of lanthanum hexaboride material for emitting said electron beam;

a grid structure for focusing said electron beam, said grid structure being disposed between said cathode and a pre-established downstream location;

filament means secured to said cathode for heating the cathode to a sufficient temperature to emit said electron beam;

a housing having a peripheral wall and a longitudinal axis extending in the same general direction as the electron beam emitted from said cathode, said electron gun being disposed within said housing;

a plurality of post members extending longitudinally within said housing and supporting said filament means within said housing in spaced relation to said peripheral wall;

support means disposed in said housing for supporting said plurality of post members;

axial positioning means for selectively axially repositioning said support means and plurality of post members simultaneously in a direction parallel to said longitudinal axis;

transverse positioning means for selectively repositioning said support means and plurality of post members simultaneously in a direction transverse to said longitudinal axis;

wherein said axial positioning means and said transverse positioning means are mutually independent to permit independent axial and transverse displacement of said electron gun in said housing.

32. The electron gun according to claim 31 wherein said peripheral wall of said housing is internally threaded; and wherein said axial positioning means includes first and second nut members disposed within said housing on opposite axial sides of said support means, each nut member being apertured to permit extension of said plurality of post members therethrough and having an outer peripherally threaded surface arranged to threadally engage said threaded peripheral wall of said housing.

33. The electron gun according to claim 32 wherein said transverse positioning means comprises a plurality of radially extending ports defined in the peripheral wall of said housing to pass adjustment screws into abutting relationship with said support means.

34. The electron gun according to claim 32 further comprising resilient means disposed between said support means and one of said nut members for providing resilient axial engagement between said one nut member and one said support means.

35. The electron gun according to claim 33 wherein said transverse positioning means comprises a plurality of radially extending ports defined in the peripheral wall of said housing to pass adjustment screws into abutting relationship with said support means.

* * * * *